United States Patent
Belwon

(10) Patent No.: US 6,337,799 B1
(45) Date of Patent: Jan. 8, 2002

(54) APPARATUS FOR CONTROLLING VOLTAGE-CHARGE CONTROLLED POWER SEMICONDUCTOR DEVICES

(75) Inventor: Waldemar Belwon, Västerås (SE)

(73) Assignee: Daimler Chrysler AG, Stuttgart (DE)

(*) Notice: Subject to any disclaimer, the term of this patent is extended or adjusted under 35 U.S.C. 154(b) by 0 days.

(21) Appl. No.: 09/762,636
(22) PCT Filed: Aug. 11, 1999
(86) PCT No.: PCT/SE99/01359
§ 371 Date: Feb. 12, 2001
§ 102(e) Date: Feb. 12, 2001
(87) PCT Pub. No.: WO00/10243
PCT Pub. Date: Feb. 24, 2000

(30) Foreign Application Priority Data

Aug. 12, 1998 (SE) ................................. 9802712

(51) Int. Cl.$^7$ ................................. H02J 1/00
(52) U.S. Cl. ........................... 363/16; 363/123
(58) Field of Search .................. 363/16, 123, 127, 363/131

(56) References Cited

U.S. PATENT DOCUMENTS 6,259,616 B1 * 7/2001 Ekwall et al. ............... 363/132

* cited by examiner

Primary Examiner—Shawn Riley
(74) Attorney, Agent, or Firm—Dykema Gossett PLLC

(57) ABSTRACT

An apparatus for controlling voltage-charge controlled power semiconductor devices in converting electric power comprises members (18–25) adapted to detect selected parameters describing the function of the power semiconductor device through the connection to the power semiconductor device. The apparatus has also means (26) adapted to compare the value of the selected function parameters detected with reference levels thereof, a programmable circuit (16) adapted to generate said reference levels for comparison and process data resulting from the comparison so as to on the basis thereof on its output deliver a digital signal corresponding to an order of a predetermined current level to or from the gate of the device, and a current stiff amplifier (30) being digitally controlled and adapted to receive the digital signal from the programmable circuit and on the basis thereof generate a current to or from the gate of the power semiconductor device with said predetermined current level for controlling the device.

18 Claims, 4 Drawing Sheets

APPARATUS FOR CONTROLLING VOLTAGE-CHARGE CONTROLLED POWER SEMICONDUCTOR DEVICES

FIELD OF THE INVENTION AND PRIOR ART

The present invention relates to an apparatus for controlling voltage-charge controlled power semiconductor devices in equipments for converting electric power, which comprises members adapted to detect function parameters of a said power semiconductor device and an arrangement adapted to control the voltage between the gate and the emitter of the power semiconductor device depending upon the value of the function parameters detected so as to by that control the power semiconductor device.

Voltage-charge controlled power semiconductor devices means power semiconductor devices being voltage controlled during the static state thereof, i.e. when they are conducting or blocking, primarily through the voltage applied between the gate and the emitter of the power semiconductor device, and charge controlled during the very switching process between the static states, since a considerable transport of charges to and from the gate is required as a consequence of the existing capacitances for changing the voltage between the gate and the emitter.

It is here pointed out that all types of such power semiconductor devices are included, such as for example IGBTs (Insulated Gate Bipolar Transistor) and MOSFETs (Metal-Oxide-Semiconductor-Field-Effect-Transistor), in which "emitter" and "collector" in the claims and in the description are to be given a broad sense and comprise also corresponding layers or regions of semiconductor devices, where these have another name, such as Drain and Source, respectively.

Said equipments for converting electric power may be of any type, such as network converters, motor inverters, battery chargers and the like, and they have one thing in common, namely that the power semiconductor devices included therein normally have to be controlled exactly with a very high frequency, i.e. the control has to have a high speed, preferably with reaction times within the nanosecond range.

It is particularly important to have this speed upon occurrence of different faults in the very equipment or in the power semiconductor devices and for being able to take care of certain protection functions, so that possibly damages of the power semiconductor devices or other parts included in the equipment and by that costly breakdowns may be avoided, or the extension of such damages may be remarkably restricted so as to keep the costs for repairs low.

Examples of objects of such a control is to achieve an overvoltage protection of the power semiconductor device upon short-circuiting, control of so called recovery phenomena of a free-wheeling diode associated with the power semiconductor device, optimising switching losses and control of the development of the collector-emitter-voltage and the collector current over the time.

Apparatuses of this type already known have been based on analogous feedbacks from the collector and the emitter of the power semiconductor device so as to form a close analogous regulating circuit or loop so as to control the turn on and turn off process and protect the power semiconductor device. Thus, a parameter-rich interaction between the power semiconductor device controlled and the analogous functions of the control apparatus takes place. Such a control apparatus designed in this way is connected to a problem that in such a construction of the control apparatus it is not possible to make it universal, i.e. manufacture a control apparatus which may be used for controlling different power semiconductor devices or for different applications. Different power semiconductor devices have for sure unique properties, and in combination with different main circuits of the apparatus in question a large amount of regulating objects are created, so that unique adjusting of the regulating hardware of the apparatus is required each time and a unique hardware has then to be produced. Furthermore, different demands on function characteristics such as voltage and current differential coefficients produces in different uses of said equipments a high number of unique adjustments of the control apparatus, and each time these requirements are changed a control apparatus having a unique hardware has to be manufactured.

SUMMARY OF THE INVENTION

The object of the present invention is to provide an apparatus of the type defined in the introduction, which is so designed that it may be considered as universal, i.e. it may be used for controlling power semiconductor devices with different properties and be used where different demands are put out from the application side.

This object is according to the invention obtained by arranging said members in such an apparatus to detect selected parameters describing the function of the power semiconductor device through connections to the power semiconductor device, and the apparatus also comprises means adapted to compare the value of the selected function parameters detected with reference levels thereof, a programmable circuit adapted to generate said reference levels for the comparison and process data resulting from the comparison so as to based thereon on its output deliver a digital signal corresponding to an order of a predetermined current level to or from the gate of the power semiconductor device, and a digitally controlled amplifier being current stiff, i.e. provided with current sources operating in constant current mode, adapted to receive the digital signal from the programmable circuit and on basis thereof through said current sources generate a current to or from the gate of the power semiconductor device with said predetermined current level for controlling the power semiconductor device.

By the fact that the control apparatus in this way manages without any analogous, closed feedbacks and it instead uses an indirect determination of the behaviour desired of the power semiconductor device, the control apparatus may be used for different power semiconductor devices in various different main circuits or equipments. This is achieved by a control of the power semiconductor device through the control of the current to and from the gate of the device depending upon the value of selected important function parameters in which it is extremely important that this current may be rapidly controlled or being able to choose this alternative instead of the closed feedbacks already known, and this is made possible by utilising a current stiff converter being digitally controlled and adapted to receive a digital signal from the programmable circuit and on the basis thereof generate the current arrived at by the programmable circuit on the basis of the results of the comparison of the parameters detected with said reference level.

The advantages of a device of the type according to the invention with respect to the control apparatuses already known and described above are many. The amount of necessary hardware when producing said equipments as well as when manufacturing and using the control apparatus is reduced, which means that test equipment has not to be modified each time new demands on the function of the control apparatus arises. Furthermore, the same control apparatus may be used in different equipments, so that the amount of different control apparatuses as well as the storing capacity needed when manufacturing them as well as the number of different spare parts are reduced. Furthermore, the documentation of changes of a construction of the control apparatus as well as the maintenance costs for the control apparatus are reduced as a consequence thereof.

Moreover, a flexibility with respect to the possibilities to adapt the function of the control apparatus to different uses, such as different voltage systems, different power semiconductor devices and different converter equipments, is obtained through the programmability, so that for example a new hardware may replace a broken hardware or a control apparatus going out of production. The only requirement is that the mechanical interface of the control apparatus to the environment is maintained. Furthermore, buyers may change power semiconductor devices after some time, when the previous device has gone out of production as a result of improvements and modifications. Several problems arising in the use may be solved by reprogramming the very hardware instead of replacing the hardware by a new or a corrected one. The programmability results also in the fact that an autonomic test of the control card on which the control apparatus is arranged may be achieved by utilising the programmable circuit. Further advantages are also there. According to preferred embodiments of the invention said members have connections to the collector, the gate and the emitter of the power semiconductor device for detecting the collector-emitter-voltage and the gate-emitter-voltage, respectively, of the power semiconductor device as the said selected parameter. It is also suitable to determine the time differential coefficient of the collector current of the power semiconductor device, in which this in a preferred embodiment of the invention may be done by arranging an auxiliary emitter connection to the emitter of the power semiconductor device closer to the latter than the so called main emitter connection for avoiding a parasitic inductance of the main emitter connection at the connection of the measuring member to the power semiconductor device and measure the voltage created between the auxiliary and the main emitter connection so as to obtain a measure of the time differential coefficient of the collector current by the fact that the programmable circuit uses the parameters detected in this way for designing an order of a predetermined current level to or from the gate of device the turn on, turn off, and protection process of the power semiconductor device may efficiently be controlled.

According to a preferred embodiment of the invention the programmable circuit has a component for connection of an arrangement for reconfiguration of the programmable circuit, i.e. reprogramming of the programmable circuit. The advantages thereof appear from the discussion above. The programmable circuit is according to another preferred embodiment of the invention adapted to enable a change of protecting control functions and adjustment of said reference levels through said programming connection after putting said equipment into service. It will in this way be possible to all the time gradually adapt the control apparatus to possible demands of the user changing or to new power semiconductor devices when old such ones are replaced.

According to another preferred embodiment of the invention the apparatus comprises members for providing feeding direct voltages for the function of the apparatus, and it has a member adapted to supervise the feeding direct voltages to different parts of the apparatus and inform the programmable circuit about the status thereof. The programmable circuit may in this way consider these feeding voltages when elaborating the orders thereof.

According to another preferred embodiment of the invention it comprises a protecting arrangement adapted to protect the power semiconductor device against uncontrollable turn on upon drop out of the feeding direct voltages by keeping the voltage between the gate and the emitter of the power semiconductor device below the level required for activating the power semiconductor device during a period of time in which such feeding direct voltages are not delivered to the apparatus. It may by this be avoided that the power semiconductor device is destroyed when operation faults occur.

According to another preferred embodiment of the invention the amplifier has a first set of current sources adapted to deliver a current of mutually different intensity to the gate of the power semiconductor device and a second set of current sources adapted to generate a current of mutually different intensity from the gate of the power semiconductor device and members adapted to control these current sources on the basis of the digital signal from the programmable circuit for controlling the power semiconductor device. The control of the power semiconductor device may in this way take place with a required high speed, i.e. within the nanosecond range, by changing the current generated by said current sources to and from the gate of the power semiconductor device that quick.

According to another preferred embodiment of the invention, which constitutes a further development of the embodiment last mentioned, the programmable circuit is adapted to deliver said digital signal in the form of a multiple bit word, in which each bit corresponds to a separate of said current sources, in the amplifier, and the current values of the different current sources are bit-weighted. The digital information from the programmable circuit may by this rapidly be D/A converted to predetermined current values resulting from the comparison mentioned above to or from the gate of the power semiconductor device without any requirement of any time for D/A-conversion except for the time for activating current sources.

According to another preferred embodiment of the invention, which also constitutes a further development of the embodiment with two sets of current sources, each said current source comprises a couple of bipolar transistors, a first of which is adapted to have a voltage applied between the collector and the emitter thereof and its base connected to the input of the amplifier for receiving a digital signal with a voltage level well defined and a second is connected by its base to the collector of the first one and by its collector to the gate of the power semiconductor device for generating a current to or from the gate, and both transistors are connected to always be in the linear operation range or be switched off depending upon if a digital "1" or "0" is received on the base of the first transistor, in which the first transistor is adapted to drive the second one. By connecting the two transistors of the respective couple to each other in this way the second transistor and by that the current delivered thereby to the gate of the power semiconductor device may be changed, i.e. be controlled, with a required high speed, by the fact that the bipolar transistors may rapidly be switched on and off when they are in the linear operation range.

Further advantages as well as advantageous features of the invention will appear from the following description and the other dependent claims.

BRIEF DESCRIPTION OF THE DRAWINGS

With reference to the appended drawings, below follows a description of preferred embodiments of the invention.

In the drawings.

DETAILED DESCRIPTION OF PREFERRED EMBODIMENTS OF THE INVENTION

Figure 1:
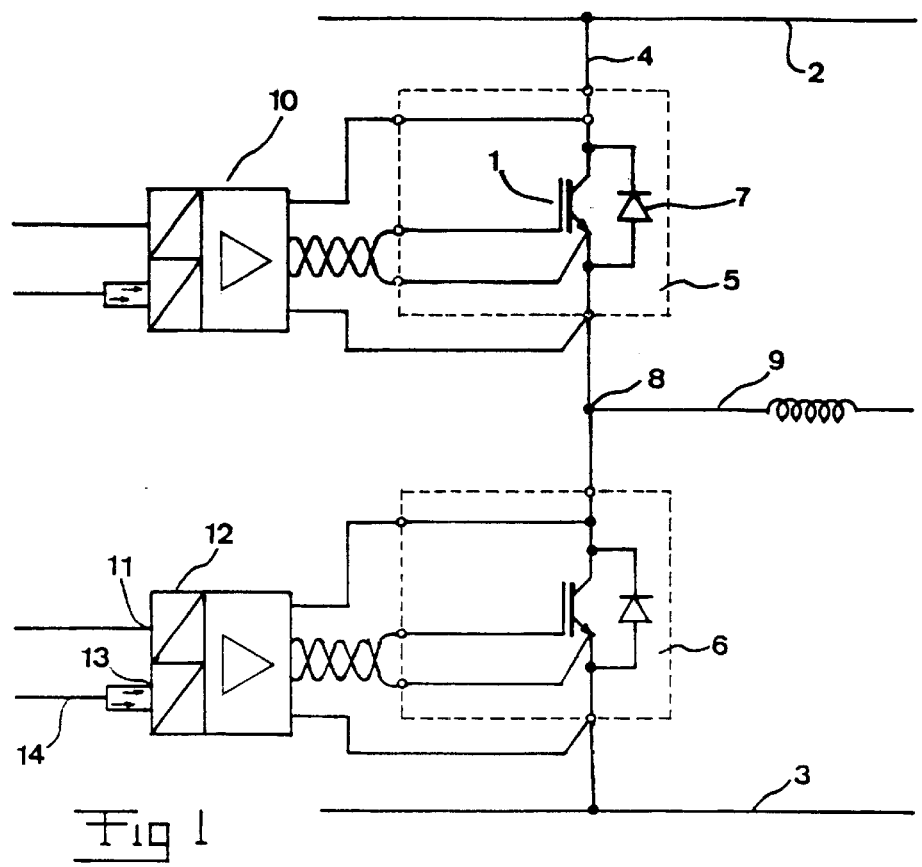
FIG. 1 is a simplified circuit diagram illustrating how the control apparatus of the type according to the invention may be arranged in an equipment for converting direct voltage to alternating voltage and conversely.

A possible application of an apparatus according to the invention in the form of apparatus for controlling a voltage-charge controlled power semiconductor device 1 in the form of for example IGBTs of so called "Punch Through" (PT)- or "Non Punch Through" (NPT)-type in a station for converting alternating voltage into direct voltage and conversely is schematically illustrated in FIG. 1, in which a phase leg 4 consisting of two so called current valve units 5, 6 connected in series is arranged between two poles 2, 3 of a direct voltage network. It is shown how the current valve units consist of a power semiconductor device each and rectifying diode 7 connected in anti-parallel therewith, but what is shown in the figure are symbols for one or a plurality of such power semiconductor devices and diodes connected in series, since the voltage to be held by the respective valve unit in the blocking state of the power semiconductor device may be to high for the power semiconductor device, for example in the order of 100 kV, while the power semiconductor device may only hold 1–10 kV. By connecting a number of such devices in series in this way in the respective current valve unit the voltage may be distributed among the different devices. These are then controlled simultaneously, so that they function as one single switching device, which may accurately be done in the case of using IGBTs, and the control apparatus according to the invention is in such a case adapted to simultaneously control the different power semiconductor devices included in the current valve unit in the same way. A phase outlet 9 for a phase of an alternating voltage network is connected to a midpoint 8 of the phase leg 4. The power semiconductor devices of the different current valve units are turned on and turned off alternatingly so as to alternatingly connect the phase outlet 9 to the potential of the two poles 2 and 3, respectively, for generating an alternating voltage in a conventional way. The matter described so far consists of conventional technique.

Figure 2:
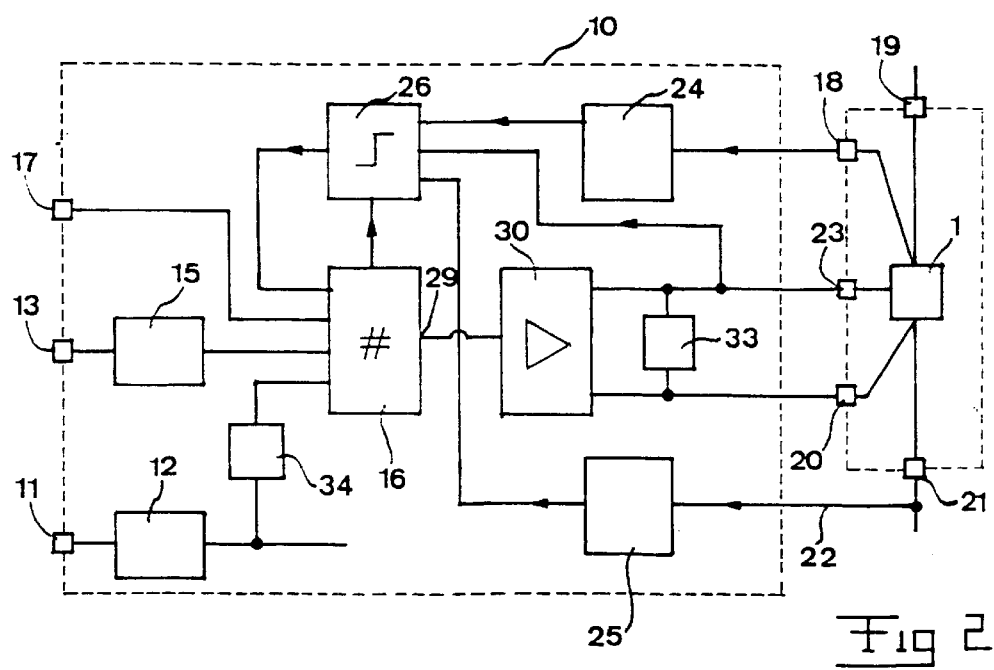
FIG. 2 is a block diagram which very simplified illustrates a control apparatus according to a preferred embodiment of the invention.

An apparatus 10 for controlling the respective power semiconductor device is connected to the respective power semiconductor device 1, and the construction thereof is described a little bit more in detail in FIG. 2 and even more in detail in FIG. 3, and reference is now made also to these two figures in the following description. The apparatus receives a feeding direct voltage for the function of the components included therein on an input 11 and has a DC/DC converter 12 for converting the feeding direct voltage into a secondary feeding direct voltage of a magnitude suited for the function of the different components. The apparatus receives on another input 13 optical signals through a light conductor from superior electronic for the entire power converter for coordinating the control of the power semiconductor device of the respective valve unit and the control of the parts of the rest of the station. By using a light conductor for these orders a galvanic separation between the superior control electronic located on low potential and the valve units of the current valve usually located on high potential is obtained. Signals may here suitably be sent in both directions on the light conductors 14. These signals are through a member 15 converted into voltage signals transmitted to a programmable circuit 16 being a part of the apparatus, for example an ispLSI (in-system programmable LSI), PLD (programmable logic device) or CPLD (complex programmable logic device).

The apparatus has also an input 17 to the programmable circuit for connecting a computer (PC) thereto for reprogramming the circuit should that be desired.

The apparatus has the following connections to the power semiconductor device: a so called control collector (or auxiliary collector) connection 18 to the collector of the device closer to the latter than the so called main collector connection 19, through which the current conducting path of converter, i.e. one pole conductor of the direct voltage network, is connected to the collector, so that a parasitic inductance of the main collector connection is avoided at the connection of the apparatus at 18. The apparatus has in a corresponding way a so called control emitter (or auxiliary emitter) connection 20 to the emitter of the power semiconductor device closer to the latter than the so called main emitter connection, through which a current conducting path of the equipment, i.e. the alternating voltage phase outlet 9, is connected to the emitter, so that a parasitic inductance of the main emitter connection 21 is avoided at the connection 20 of the apparatus. Thus, we are studying the current valve unit with control apparatus shown uppermost in FIG. 1. The control apparatus has also a connection 22 to the main emitter connection 21. Finally, the apparatus is connected to the gate of the power semiconductor device through a gate connection 23.

The control apparatus or the control member as it is normally called is adapted to control the power semiconductor device on the basis of information, which may be received through the connections just described about selected parameters describing the function of the power semiconductor device. These parameters are preferably the collector-emitter-voltage, which may be received from the connections 18 and 20 or 21, the gate-emitter-voltage, which may be received from the connections 23 and 20 or 21 as well as the time differential coefficient of the collector current, which may be received from the connections 20 and 21, since the parasitic inductance of the main emitter connection 21 will result in a considerable voltage between the two connections 20 and 21, well in the order of 50V, upon rapid changes of the collector current through the power semiconductor device.

Figure 3:
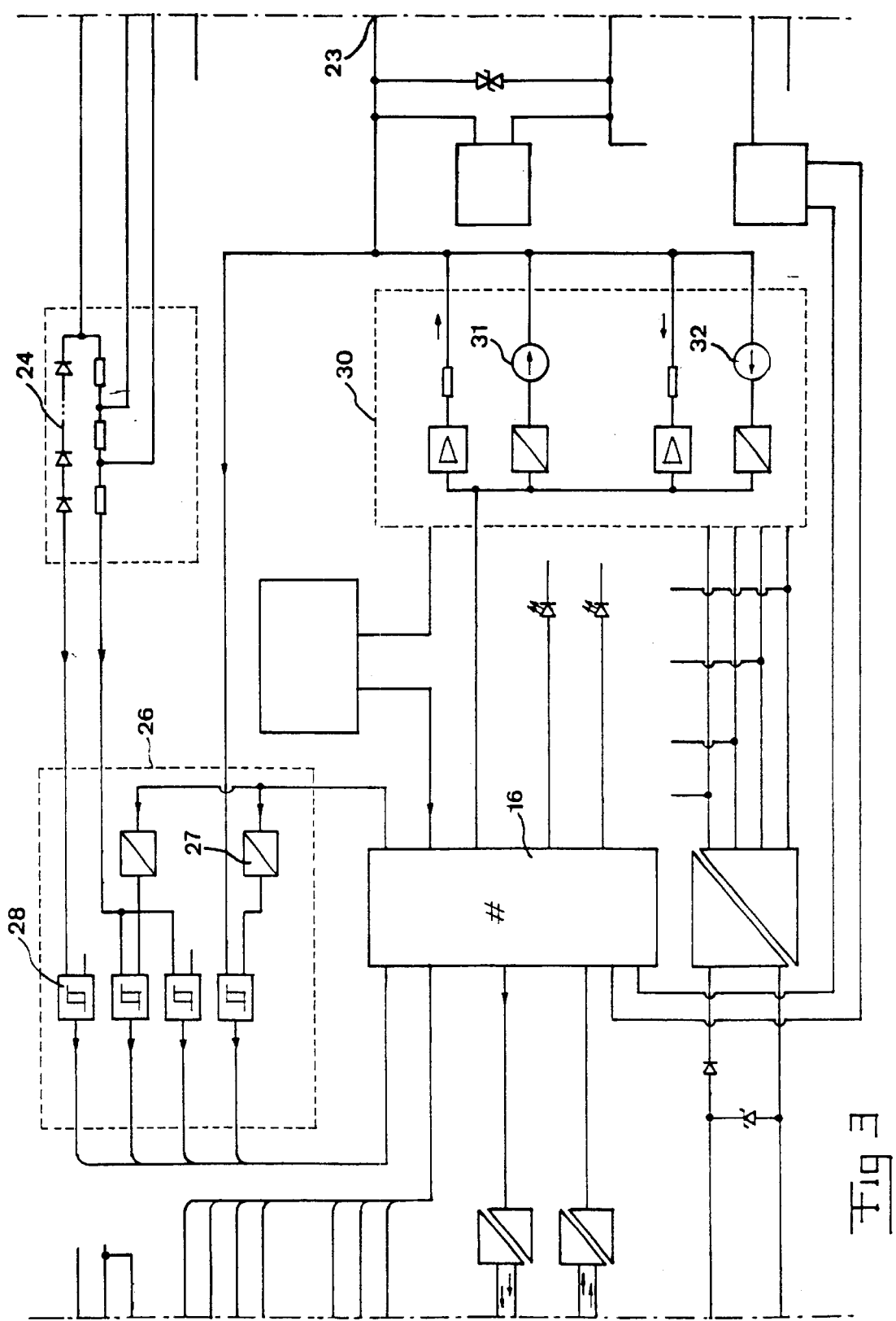
FIG. 3 is a somewhat more detailed view of the control apparatus illustrated in FIG. 1.

The voltage signals from the connection 18 as well as those from the connection 22 are received by so called standardisation blocks 24 and 25, respectively, which are adapted to divide the respective detection voltage signal into signals with different measuring range, as illustrated for 24 in FIG. 3. Signals suitable to be handled in a means 26 adapted to compare the value of these signals with reference levels corresponding to predetermined current values of a current sent through the connection 23 to or from the gate of the power semiconductor device and utilised for controlling the power semiconductor device in a way to be explained further below are obtained in this way. Said reference levels are generated by the programmable circuit 16 and are sent to the comparing means 26 in the form of digital signals, which are converted into analogous such ones in the converter 27 for comparison in different comparators 28 with signals coming from the blocks 24 and 25. The comparing means 26 is adapted to send results of this comparison to a programmable circuit 16, which is adapted to process these data so as to deliver a digital signal on the output 29 thereof corresponding to an order of a predetermined current level to or from the gate of the power semiconductor device on the basis of these data.

Furthermore, the apparatus comprises a current stiff amplifier 30 being digitally controlled and adapted to receive the digital signal from the programmable circuit 16 and on the basis thereof generate a current to or from the gate 23 of the power semiconductor device having said predetermined current level for controlling the power semiconductor device. The amplifier has for this sake two sets of current sources, which are summarised at 31 and 32, namely a first one for generating a current to the gate of the power semiconductor device and a second one for generating a current from the gate. The construction of this amplifier will be explained more in detail further below with reference to primarily FIGS. 4 and 5.

The apparatus has also a so called "gate-guard" 33, which forms a protecting arrangement adapted to protect the power semiconductor device against uncontrolled turn-on when the feeding direct voltages drops out by keeping the voltage between the gate and the emitter of the power semiconductor device below the level required for activating the power semiconductor device during the period of time in which such feeding direct voltages are not delivered to the apparatus. Furthermore, the apparatus is provided with a member 34 adapted to supervise the feeding direct voltages to different parts of the apparatus and inform the programmable circuit about the status thereof.

Figure 4:
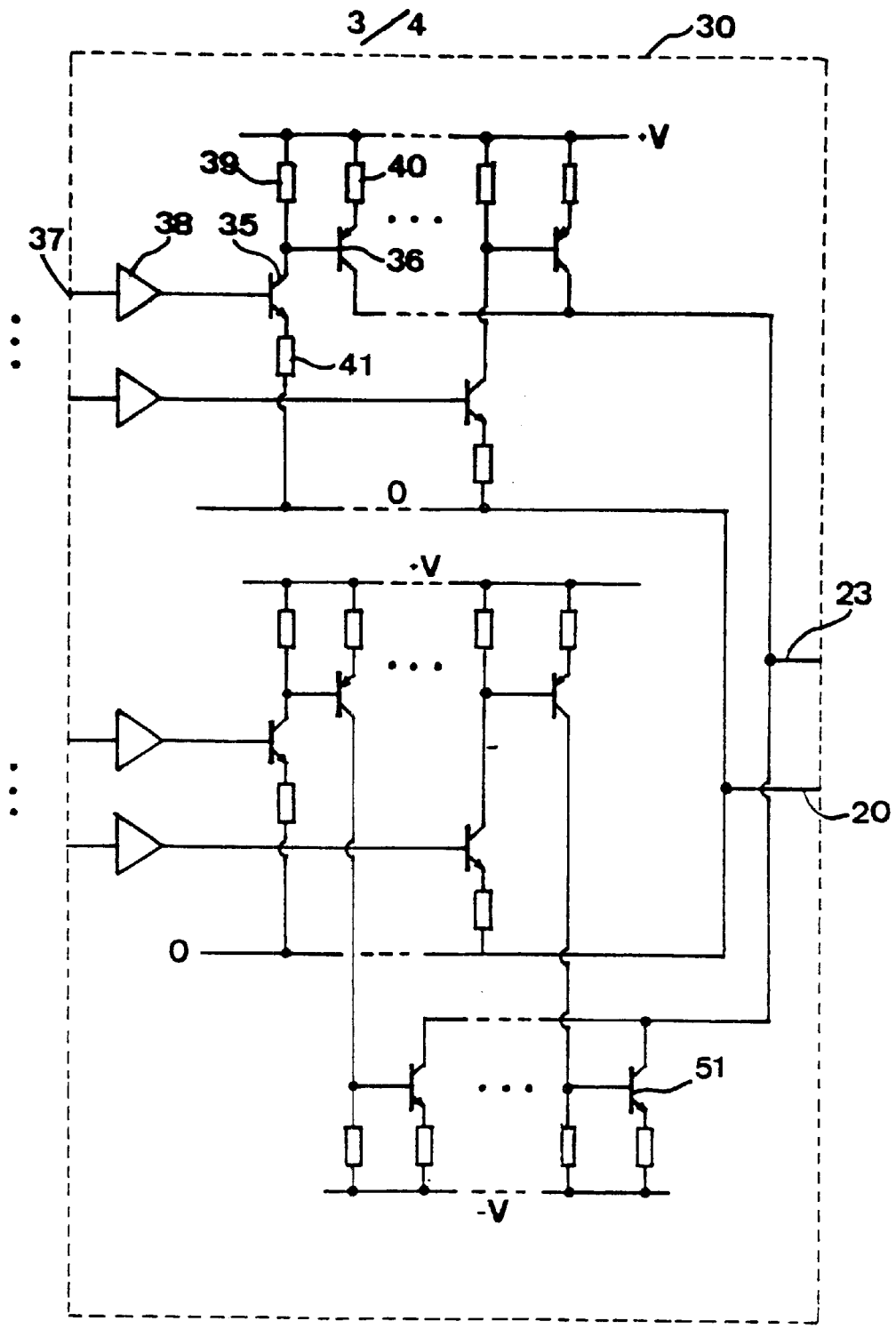
FIG. 4 is a circuit diagram illustrating the construction of the current stiff amplifier being digitally controlled of the control apparatus according to FIG. 2.
Figure 5:
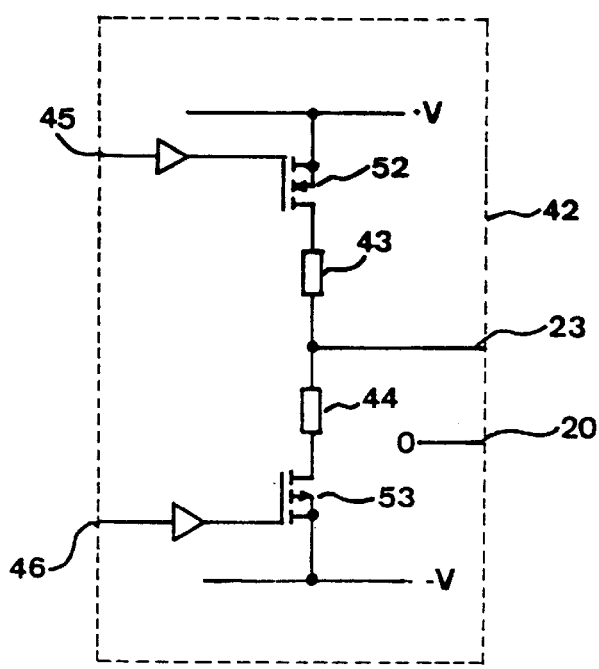
FIG. 5 is a diagram illustrating a resistive end stage of the current stiff amplifier being digitally controlled according to FIG. 4.

The amplifier is shown more in detail in FIG. 4. It has a fast current-strong digital buffer 38 arranged at the input of the amplifier to receive the weak digital signal transmitted by the programmable circuit 16 and arriving at the input 37 and amplify as well as levelstabilising it. The buffer is fed with 5 V, and a logical "1" on the output is represented by a stiff and well defined voltage, for example 4.6 V. By the fact that the base of a first bipolar transistor 35 is connected to the output of the buffer this receives a stiff digital signal of 4.6 V, so that this transistor 35 will rapidly lift the emitter potential thereof to about 4 V. A transistor 35 is through a resistor 41 connected to zero potential. By the fact that the voltage drop base-emitter of the transistor 35 is 0.6 V the voltage over the resistor 41 will be 4 V. Accordingly, a current will flow through the resistor 41 and the collector current will be constant and well defined as the current through the resistor 41=the voltage over the resistor 41/the resistance of the resistor 41.

The amplifier has a second bipolar transistor 36, the base of which is connected to the collector of the first bipolar transistor. The collector of the first bipolar transistor is through a resistor 39 connected to +V, while the emitter of the second transistor 36 is through a resistor 40 connected to the same potential. Furthermore, the collector of the second bipolar transistor 36 is connected to the gate 23 of the power semiconductor device.

The resistors 41 and 39 are selected so as to create a stiff reference voltage for the base of the second transistor 36 and keep the transistor 35 in the linear operation range, i.e. the voltage over collector-emitter of the transistor 35 is always larger than a couple of volts. The reference for the base of the second transistor is created through a resistor 39 and this process is repeated by the fact that the transistor 36 rapidly lifts the emitter potential thereof to a level of the base potential +0.6 V, where-through current flows through the resistor 40 and a well defined and constant collector current of the transistor 36 is generated to the gate 23 of the power semiconductor device.

Accordingly, it may generally be said that a current source formed by the first transistor 35 and the resistor 41 drives a current source formed by the second transistor 36 and the resistor 40. This is the key to the high speed of the current stiff amplifier being digitally controlled. It is namely well known that a bipolar transistor may be switched off rapidly when it is in the linear operation range, which may be explained by the fact that no holes are injected from the base into the collector layer. Both the first transistor 35 and the second transistor 36 are in the present case always either in the linear operation range or switched off. For further shortening the switching times the resistors 39, 40 and 41 are dimensioned with very low values for rapidly transport charge carriers upon switching. The fact that the digital signal at the base of the first transistor 35 received from the buffer 38 at the same time will be reference for an analogous current value as well as that the current sources are weighted in the way described below, so that no time is needed for any digital/analogous-conversion, is another circumstance that contributes to the high speed of the amplifier. More exactly, each set n has inputs 37 and n couples of bipolar transistors, i.e. current sources, in which however in the fact 35, 41 plus 36, 40 are to be considered as one current source, and the upper set as seen in FIG. 4, is adapted to generate a current to the gate of the power semiconductor device and the lower set a current from the gate of the power semiconductor device.

It is pointed out that two transistors switched in constant current mode—35, 41 and 36, 40—are needed for obtaining a level shift as a consequence of the feeding of the programmable circuit 16 and the buffer 38 by the feeding for digital circuits, which often is +5 V, while the current stiff digital amplifier is switched between +V and −V potential, which often is higher than 5 V.

The current sources that generate a current from the gate 23 of the power semiconductor device, i.e. belong to the lower set shown in FIG. 4, are constructed according to the same technique as the upper set but completed by a further transistor in constant current mode so as to obtain a level shift from +V to −V. This is achieved by the transistor 51.

It is also pointed out that all transistors shown in FIG. 4 operate within the linear operation range. Constant current mode current sources are not only used for making the amplifier faster, but also for rapidly pressing a current (charge) of a well defined value into the gate of the power semiconductor device in spite of parasitic inductances of the connections and the internal damping resistance of the power semiconductor device, the value of which is often strongly dependent upon the temperature. Furthermore, when a change of the voltage between the gate 23 and the emitter 20 from −V to +V takes place upon switching the power semiconductor device on or from +V to −V upon switching off the current sources will be able to deliver a constant current value, i.e. a well defined charge, within almost the entire voltage range +/−V.

Furthermore, the programmable circuit is adapted to deliver said digital signal in the form of a multiple bits word, in which each bit corresponds to a separate of said current sources in the amplifier, i.e. for separate of the two n inputs, and the current values of the different current sources are bit-weighted, namely according to $2^0 \ldots 2^{n-1}$ with the less significant current sources from the top and an increase of the degree of significance downwardly with respect to the inputs 37 and the representation thereof in FIG. 4. The immediate conversion of the digital ones on the different inputs 37 into an analogous voltage signal on the base of the respective first bipolar transistor and the way in which the current sources are constructed makes it possible to change, i.e. control, the current to or from the gate of the power semiconductor device as fast as required, well within 20 ns.

However, a current source fed from +V may not deliver current when the gate 23 of the power semiconductor device is charged to +V. The constant current demanded will then only be obtained until the potential of the gate 23 is lower than that of the base of the first bipolar transistor 35, and the current source will for the rest drive less current until it bottoms (non-linear-operation range) and gets slow in switching. The corresponding restriction is also there for the current sources generating current from the gate of the power semiconductor device. For finding a remedy to these inconveniences the amplifier is supplemented by a non-current stiff resistive end stage 42 illustrated in FIG. 5. For charging the gate of the power semiconductor device up to +V-potential a p-channel-MOSFET-transistor 52 is connected between +V and a resistor 43, which in its turn is connected to the gate 23 of the power semiconductor device. The gate of the transistor 52 is controlled according to on/off principal through a level shift stage connected to a digital control signal 45. A n-channel-MOSFET-transistor 53 is in a corresponding way for charging the gate of the power semiconductor device down to −V-potential connected between −V and a resistor 44, which in its turn is connected to the gate 23 of the power semiconductor device. The gate of the transistor 53 is controlled according to on/off-principal through a level shift stage connected to the digital control signal 46.

Figure 6:
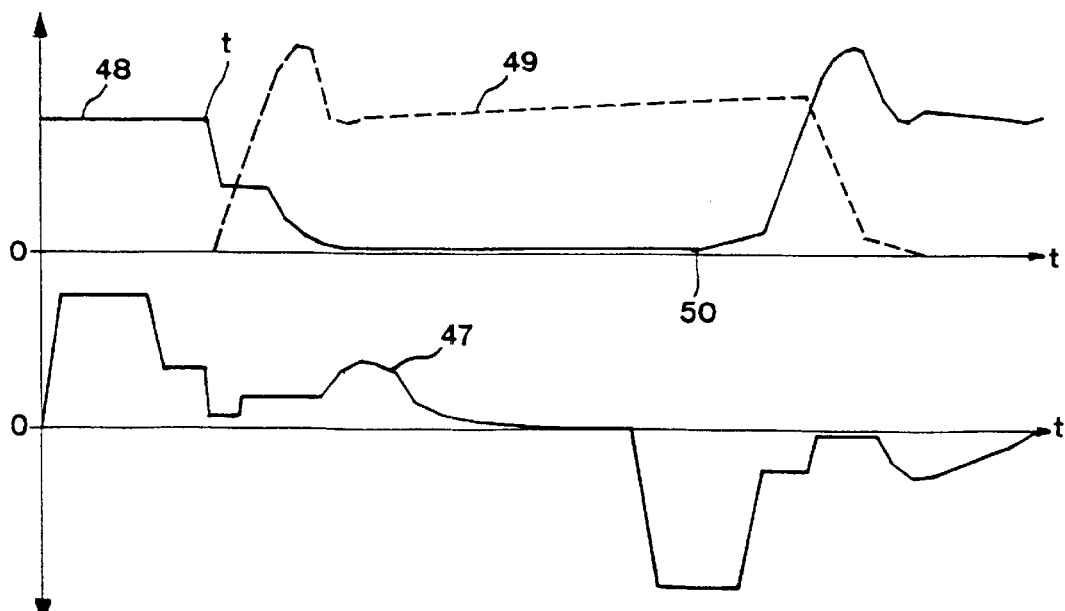
FIG. 6 is a graph illustrating the development of the collector-emitter-voltage and the collector current over the time at different values of the current to and from the gate of the power semiconductor device of a control apparatus according to the invention in different states of a power semiconductor device controlled by the control apparatus.

It is illustrated in FIG. 6 how the power semiconductor device may be controlled by varying the control current 47. When switching or turning the power semiconductor device on an on-signal is first received on the input 13, whereupon the programmable circuit will turn the power semiconductor device on according to a pre-programmed algorithm. When the feeding voltage is as it should be positive current sources, i.e. current sources for conduction of current to the gate, will increase the control current 47 to 10 A. When the gate-emitter-voltage measured in the control apparatus reaches about 3 V the control current is reduced to about 6 A. When after that the voltage over the main emitter and the auxiliary emitter indicates a positive collector current time differential coefficient the control current is reduced to 1 A. When after that the corresponding voltage indicates a negative collector current time differential coefficient the current is increased for rapidly charge the gate emitter potential to +15 V. The power semiconductor device is after that turned on and will be turned on until the moment 50, at which the turn-off process is started in the following way: a turn-off signal is received on the input 13, and the programmable circuit will then turn off the power semiconductor device according to a pre-programmed algorithm, and the negative current sources will first increase the control current to −12 A. When the measured collector-emitter-voltage rises above 10 V the control current is reduced to 4 A. When the collector-emitter-voltage rises above an overvoltage protection level pre-programmed the control current is reduced to 1.5 A. After the turning-off of the power semiconductor device the control voltage is maintained at −15 V during the rest of the turn-off period.

Accordingly, stiff current means here constant current having a level that may be controlled by a multiple bits word, i.e. digitally. Thus, a current stiff amplifier is an amplifier provided with current sources operating in constant current mode.

Generally, for example an arbitrary amount of different IGBTs with $I_c$=300 A–2 400A, $V_{CE}$=1 200 V–6 500 V at system voltages from 400 DC to 4 200 DC may be controlled through one and the same apparatus according to the invention of the type described above.

The invention is of course not in any way restricted to the preferred embodiments described above, but many possibilities to modifications thereof would be apparent to a man with ordinary skill in the art without departing from the basic idea of the invention.

It is for example not at all necessary that there is a separate comparator block 26, but this could be integrated in the programmable circuit 16.

It is neither necessary that the communication at 13 with the control apparatus takes place through light.

The converter 12 may in the case of an uninsulated system in some cases be omitted.

What is claimed is:

1. An apparatus for controlling voltage-charge controlled power semiconductor devices in equipments for converting electric power, which comprises members adapted to detect function parameters of a said power semiconductor device and an arrangement adapted to control the voltage between the gate and the emitter of the power semiconductor device depending upon the value of the function parameters detected so as to by that control the power semiconductor device wherein said members are adapted to detect selected parameters describing the function of the power semiconductor device through connections to the power semiconductor device, and that the apparatus also comprises means adapted to compare the value of the selected function parameters detected with reference levels thereof, a programmable circuit adapted to generate said reference levels for comparison and process data resulting from the comparison so as to based thereon on its output deliver a digital signal corresponding to an order of a predetermined current level to or from the gate of the power semiconductor device, and a digitally controlled amplifier being current stiff, i.e., provided with current sources operating in constant current mode, adapted to receive the digital signal from the programmable circuit and on basis thereof through said current sources generate a current to or from the gate of the power semiconductor device with said predetermined current level for controlling the power semiconductor device.

2. An apparatus according to claim 1, wherein said members have connections to the collector and emitter of the power semiconductor device for detecting the collector-emitter-voltage of the power semiconductor as one said selected parameter.

3. An apparatus according to claim 1, wherein said members have connections to the gate and the emitter of the power semiconductor device for detecting the gate-emitter-voltage of the power semiconductor device as one said selected parameter.

4. An apparatus according to claim 1, wherein said members have an auxiliary collector connection to the collector of the power semiconductor device closer to the latter than the so called main collector connection, through which the current conducting path of the equipment is connected to the collector, so that a parasitic inductance on the main collector connection is avoided at the connection of the measuring member.

5. An apparatus according to claim 1, wherein said members have an auxiliary emitter connection to the collector of the power semiconductor device closer to the latter than the so called main emitter connection, through which the current conducting path of the equipment is connected to the emitter, so that a parasitic inductance on the main emitter connection is avoided at the connection of the measuring member.

6. An apparatus according to claim 5, wherein said members are adapted to detect voltage generated between the auxiliary and main emitter connection as a consequence of said parasitic inductance upon changes of the collector current of the power semiconductor device so as to by that indirectly detect the time differential coefficient of the collector current as one said selected parameter describing the function of the power semiconductor device.

7. An apparatus according to claim 2, wherein said members comprises means connected to the respective connection and adapted to divide the detection signal coming thereto from the connection into signals with different range for transmitting the signals last mentioned to the comparing means.

8. A device according to claim 1, wherein the programmable circuit has a component for connecting an arrangement for reconfiguration of the programmable circuit, i.e., reprogramming of the programmable circuit.

9. A device according to claim 8, wherein the programmable circuit is adapted to enable a change of protecting control functions and adjustment of said reference levels through said programming connection after putting said equipment into service.

10. An apparatus according to claim 1, wherein the programmable circuit has a connection for communication with a superior control electronic of said equipment.

11. An apparatus according to claim 1, wherein it comprises members for providing feeding direct voltages for the function of the apparatus.

12. An apparatus according to claim 11, wherein it has a member adapted to supervise the feeding direct voltages to different parts of the apparatus and inform the programmable circuit of the status thereof.

13. An apparatus according to claim 11, wherein it comprises a protecting arrangement adapted to protect the power semiconductor device against uncontrollable turn on upon drop out of the feeding direct voltages by keeping the voltage between the gate and the emitter of the power semiconductor device below the level required for activating the power semiconductor device during a period of time in which such feeding direct voltages are not delivered to the apparatus.

14. An apparatus according to claim 1, wherein the amplifier has a first set of current sources adapted to deliver a current of mutually different intensity to the gate of the power semiconductor device and a second set of current sources adapted to generate a current of mutually different intensity from the gate of the power semiconductor device and members adapted to control these current sources on the basis of the digital signal from the programmable circuit for controlling the power semiconductor device.

15. An apparatus according to claim 14, wherein the programmable circuit is adapted to deliver said digital signal in the form of a multiple bit word, in which each bit corresponds to a separate of said current sources in the amplifier, and that the current values of the different current sources are bit-weighted.

16. An apparatus according to claim 14, wherein each said current source comprises a couple of bipolar transistors, a first of which is adapted to have a voltage applied between the collector and the emitter thereof and its base connected to the input of the amplifier for receiving a digital signal with a voltage level well defined and a second is connected by its base to the collector of the first one and by its collector to the gate of the power semiconductor device for generating a current to or from the gate, and that both transistors are connected to always be in the linear operation range or be switched off depending upon if a digital "1" or "0" is received on the base of the first transistor, in which the first transistor is adapted to drive the second one.

17. An apparatus according to claim 16, wherein the first bipolar transistor has the emitter thereof through a resistor connected to zero potential and the second bipolar transistor has its emitter through a resistor connected to a positive potential.

18. An apparatus according to claim 1, wherein the current stiff amplifier being digitally controlled comprises a non-current stiff end stage adapted to control the power semiconductor device by means of a resistor included therein for turning on and the conducting state of the power semiconductor device and a resistor for turning off and the blocking state of the power semiconductor device.

* * * * *